United States Patent [19]

Tay

[11] Patent Number: 4,994,762
[45] Date of Patent: Feb. 19, 1991

[54] MULTILOOP SYNTHESIZER WITH OPTIMAL SPURIOUS PERFORMANCE

[75] Inventor: Wan F. Tay, Coral Springs, Fla.

[73] Assignee: Motorola, Inc., Schaumburg, Ill.

[21] Appl. No.: 438,561

[22] Filed: Nov. 20, 1989

[51] Int. Cl.$^5$ ............................ H03L 7/07; H03L 7/18
[52] U.S. Cl. ............................................ 331/2; 331/25; 331/30
[58] Field of Search .................... 331/1 A, 2, 25, 30, 331/43

[56] References Cited

U.S. PATENT DOCUMENTS

| | | | |
|---|---|---|---|
| 3,588,732 | 6/1971 | Tollefson | 331/2 |
| 4,186,356 | 1/1980 | Remy | 332/19 |
| 4,225,830 | 9/1980 | Remy | 331/2 |
| 4,331,932 | 5/1982 | Remy | 331/2 |
| 4,551,689 | 11/1985 | Scala et al. | 331/2 |
| 4,763,083 | 8/1988 | Edwards | 331/2 |

Primary Examiner—Siegfried H. Grimm
Attorney, Agent, or Firm—Pablo Meles

[57] ABSTRACT

An improved mixed down synthesizer scheme 10 having a first phase locked loop 12 and a second phase locked loop 14 provides a first frequency and a second frequency respectively. The first phase locked loop 12 has at least a first programmably tunable filter 30 and a mixer 28. The second phase locked loop 14 has an output received by the mixer 28 in the first phase locked loop 12. A controlling means (18 and 20) controls the first and second frequencies and tunes the first programmably tunable filter 30. The first and the second phase locked loops 12 and 14 are programmed to maintain a constant frequency ratio between the first and second frequencies in order to maintain a minimum frequency offset from the mixed-in spurious products.

20 Claims, 1 Drawing Sheet 4,994,762

MULTILOOP SYNTHESIZER WITH OPTIMAL SPURIOUS PERFORMANCE

TECHNICAL FIELD

This invention relates generally to phase locked loops, and more specifically to phase locked loops with optimal spurious performance.

BACKGROUND

The tuning bandwidth of a conventional single loop analog synthesizer often has a narrow tuning bandwidth (below 20% bandwidth), due to limitations in the tuning range of the varactor diode. More particularly applicable to low band and mid band ranges, if a high resonator Q is desired for good sideband noise performance, then a large and bulky resonating coil is usually required. The typical techniques used to diminish these problems involves the use of the divide down synthesis method or the mix down synthesis method.

Use of the divide down synthesis method generally reduces the size of the coil when a higher frequency voltage controlled oscillator (VCO) is used, but fails to provide an adequate tuning range due to the limits of the divider ratio. The conventional mix down method eliminates the problems with coil size and limits in tuning range, but adds the additional problem of inherent in-band spurious response signals due to Able-Baker mixing products. The Able-Baker spurious response signals cannot be filtered out due to their proximity to the desired signal over a wide frequency band. Therefore, a need for a mix down synthesizer method that reduces the in-band spurious response signal problems is required.

SUMMARY OF THE INVENTION

Accordingly, it is an object of the present invention to provide an improved mixed down synthesizer scheme having a first phase locked loop and a second phase locked loop providing a first frequency and a second frequency respectively. The first phase locked loop has at least a first programmably tunable filter and a mixer. The second phase locked loop has an output received by the mixer in the first phase locked loop. A controlling means controls the first and second frequencies and tunes the first programmably tunable filter.

The first and the second phase locked loops are programmed to maintain a narrow frequency ratio range between the first and second frequencies in order to maintain a minimum frequency offset of the spurious products from the desired frequency.

DETAILED DESCRIPTION OF THE PREFERRED EMBODIMENT

Figure 1:
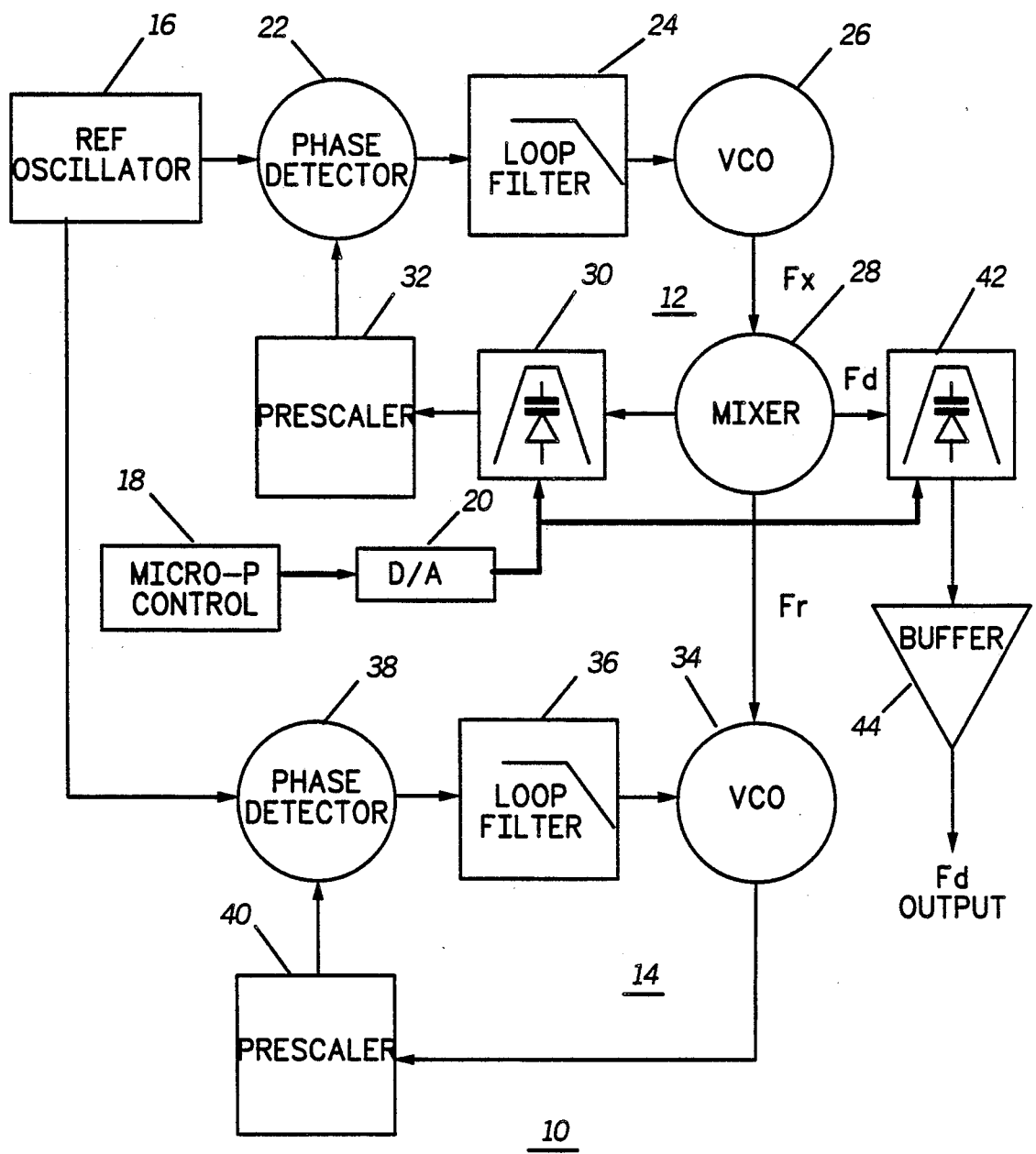
FIG. 1 is a schematic diagram of a dual phase locked loop in accordance with the present invention.

Referring to FIG. 1, there is shown a mixed down synthesizer scheme 10 in accordance with the present invention. As illustrated, the dual looped mixed down synthesizer scheme 10 has a single frequency source, preferably a reference oscillator 16 that provides a reference signal to a first loop 12 and a second loop 14, although a separate frequency source may optionally be provided for each loop. The first loop 12 and the second loop 14 provide a first frequency and a second frequency respectively. The first loop 12 has a conventional phase detector 22 that receives the reference signal and a first prescaled signal from a prescaler (programmable divider) 32, and provides a phase detected signal. The phase detected signal is applied as an input into a loop filter 24. The loop filter 24 provides a filtered voltage signal and is applied as a controlling voltage input to a voltage controlled oscillator 26 for developing an output useful as an injection signal input $F_x$ to a mixer 28. After the injection signal from the VCO 26 is mixed in the mixer 28, the output of the mixer 28, a desired signal $F_d$, is applied to a first programmable tunable filter, preferably a varactor tuned filter 30 within the first loop 12. The output of the varactor tuned filter 30 is applied to the prescaler 32, preferably a dual modulus prescaler. Note that the desired signal $F_d$ from the mixer 28 can be split to provide the desired signal $F_d$ to the filter 42 in the output stage of the mixed down synthesizer scheme 10.

The mixer 28 also receives an injection signal $F_r$ from a VCO 34 in the second loop 14. The mixer 28 mixes the injection signals $F_x$ and $F_r$ from the VCOs 28 and 34 to provide the desired signal $F_d$ to varactor tuned filter 30 and, optionally, to another varactor tuned filter 42 in the output stage of the mixed down synthesizer scheme.

The second loop 14 has a phase detector 38 that receives the reference signal from the reference oscillator 16 and a prescaled signal from a prescaler 40 and provides a phase detected signal. The phase detected signal is applied as an input to a loop filter 36. The loop filter 36 provides a filtered voltage signal and is applied as a controlling voltage input to a voltage controlled oscillator 34. The output or the injection signal from the VCO 34 is then applied to the prescaler 40, preferably another dual modulus prescaler which provides a second prescaled signal. The second prescaled signal is then fed back to the phase detector 38. The output or injection signal from the VCO 34 is also applied to the reference injection port of the mixer 28. The second loop 14 acts as a programmable frequency reference source for the mixer 28. The output $F_d$ from the mixer 28 after mixing a signal injection signal $F_r$ from (the VCO 34 in) the second loop 14 with the injection signal $F_x$ from (the VCO 26 in) the first loop 12 provides a desired signal. The output of the mixer 28, the desired signal, is applied to the programmable tunable filter 42 in the output stage of the mixed down synthesizer scheme 10. The output stage of the mixed down synthesizer 10 preferably has at least one buffer 44 for buffering the output signal from the varactor tuned filter 42.

Varactor tuned filters 30 and 42 are both programmably tuned by a processor 18, preferably a MC68HC11 microcontroller manufactured by Motorola. Processor 18 also can control the divisors of the prescalers 32 and 40. The filters 30 and 42 are controlled by the processor 18 via a digital-to-analog convertor 20. The filters 30 and 42 are programmably tuned so that an almost constant frequency ratio between the first frequency and second frequency is maintained in order to maintain a minimum frequency offset from mixed-in spurious product or the spurious frequencies. The constant frequency ratio is dependent on the operating frequency and the desired spurious performance. Typically, there are numerous ratio ranges providing good spurious performance, but the range between 0.83 and 0.9 is preferred. By keeping the spurious frequencies at a minimum offset frequency from the desired signal's frequency, a constant bandwidth filter can be designed to easily filter out Able-Baker type and other in-band spurious responses. This provides an improved in-band spurious response over a wide range of frequencies.

In an alternative embodiment (not shown), all programmably tunable filters (42 and 30) can be located in the output stage, preferably receiving the desired signal from the mixer 28. A low pass filter (not shown) can replace the filter 30 in loop 12. When a low pass filter is used, a smaller bandwidth is obtained. Again, the filters (42 and 30) can be controlled by a microprocessor 18 via a D-to-A convertor. The outputs from the filters (42 and 30) are preferably buffered.

What is claimed is:

1. A mixed down synthesizer scheme, comprising:
    a first phase locked loop, providing a first frequency and having at least a first programmably turnable filter and a mixer;
    a second phase locked loop, providing a second frequency having an output received by said mixer in the first phase locked loop; and
    a controlling means for controlling said first and second frequencies and for tuning said first programmably tunable filter.

2. The mixed down synthesizer scheme of claim 1, wherein the first and second phase locked loops receive a reference signal from at least one reference oscillator.

3. The mixed down synthesizer scheme of claim 1, wherein a second programmably tunable filter is coupled to the output of said mixer, said second programmably tunable filter being tuned by said controlling means.

4. The mixed down synthesizer scheme of claim 1, wherein said controlling means comprises a microprocessor and at least one digital-to-analog convertor.

5. The mixed down synthesizer scheme of claim 1, wherein each of said first and second phase locked loops has at least a prescaler coupled to a phase detector.

6. The mixed down synthesizer scheme of claim 5, wherein each of said first and second phase locked loops further comprises a loop filter.

7. The mixed down synthesizer scheme of claim 5, wherein each of said first and second phase locked loops further comprises a voltage controlled oscillator.

8. The mixed down synthesizer scheme of claim 5, wherein said controlling means controls each prescaler in the first and second phase locked loops.

9. The mixed down synthesizer scheme of claim 3, wherein a buffer is coupled to the output of the second tunable filter.

10. A mixed down synthesizer scheme, comprising:
    a first phase locked loop, providing a first frequency and having at least a first programmably tunable filter and a mixer; and
    a second phase locked loop, providing a second frequency having an output received by said mixer in the first phase lock loop;
    a controlling means for controlling said first and second frequencies and for tuning said first programmably tunable filter;
    a reference oscillator coupled to each of said first and second phase locked loops for providing a reference signal to each phase locked loop.

11. The mixed down synthesizer scheme of claim 10, wherein the first and second phase locked loops comprise a first and a second phase detector respectively, each receiving a reference signal from the reference oscillator and a prescaled signal from a first and a second prescaler respectively for providing a first and a second phase detected signal.

12. The mixed down synthesizer scheme of claim 11, wherein said first and second phase locked loops comprise a first and a second loop filter respectively for receiving the first and the second phase detected signal respectively and for providing a first and a second filtered voltage signal.

13. The mixed down synthesizer scheme of claim 12, wherein said first and second phase locked loops comprise a first and a second voltage controlled oscillator respectively for receiving said first and said second filtered voltage signal respectively and providing a first and a second injection signal to the mixer.

14. The mixed down synthesizer scheme of claim 13, wherein said mixer, having a reference injection port, receives the first and the second injection signals from the first and the second voltage controlled oscillators to provide a desired signal to an output stage and to the first programmably tunable filter.

15. The mixed down synthesizer scheme of claim 14, wherein said output stage comprises a second programmably tunable filter and a buffer.

16. The mixed down synthesizer scheme of claim 11, wherein said controlling means comprises a microprocessor and said first programmably tunable filter, comprises a programmably tunable varactor filter.

17. A method to programmably obtain an optimal mixing frequency ratio for optimal spurious performance, comprising the steps of:
    (a) providing a first frequency with a first phase locked loop;
    (b) providing a second frequency with a second phase locked loop;
    (c) mixing said first and second said frequencies to provide a desired frequency along with spurious products;
    (d) programming said first and said second phase locked loops such that the ratio between the first and second frequencies are within an optimum spurious range;
    (e) programming at least one tunable filter to filter any mixed spurious products.

18. The method of claim 17, wherein the ratio of step (d) is within the range between 0.83 and 0.9.

19. The method of claim 17, wherein programming the first and the second phase locked loops further comprises maintaining a substantially constant frequency ratio between the first and second frequencies in order to maintain a minimum frequency offset from the mixed-in spurious products.

20. A mixed down synthesizer scheme, comprising:
    a first phase locked loop having a mixer, providing a first frequency;
    a second phase locked loop, providing a second frequency having an output received by said mixer in the first phase locked loop;
    a controlling means for controlling said first and second frequencies and for tuning at least a first programmably tunable filter.

* * * * *